(12) United States Patent
Testani et al.

(10) Patent No.: US 11,264,791 B2
(45) Date of Patent: Mar. 1, 2022

(54) SMART WIRING DEVICES

(71) Applicant: Pass & Seymour, Inc., Syracuse, NY (US)

(72) Inventors: Anthony M. Testani, Syracuse, NY (US); Joshua P. Haines, Marcellus, NY (US); Thomas Cunningham, Victor, NY (US)

(73) Assignee: Pass & Seymour, Inc., Syracuse, NY (US)

( * ) Notice: Subject to any disclaimer, the term of this patent is extended or adjusted under 35 U.S.C. 154(b) by 226 days.

(21) Appl. No.: 16/233,383

(22) Filed: Dec. 27, 2018

(65) Prior Publication Data

US 2019/0195932 A1 Jun. 27, 2019

Related U.S. Application Data

(60) Provisional application No. 62/610,738, filed on Dec. 27, 2017.

(51) Int. Cl.
| | |
|---|---|
| *H04W 84/18* | (2009.01) |
| *H02H 3/33* | (2006.01) |
| *G01R 31/08* | (2020.01) |
| *H04L 45/28* | (2022.01) |
| *H02H 11/00* | (2006.01) |
| *G01R 31/52* | (2020.01) |
| *H04W 40/28* | (2009.01) |
| *H04W 84/02* | (2009.01) |
| *G01R 31/67* | (2020.01) |

(52) U.S. Cl.
CPC ............ *H02H 3/33* (2013.01); *G01R 31/086* (2013.01); *G01R 31/52* (2020.01); *H02H 11/002* (2013.01); *H04L 45/28* (2013.01); *G01R 31/67* (2020.01); *H04W 40/28* (2013.01); *H04W 84/02* (2013.01); *H04W 84/18* (2013.01)

(58) Field of Classification Search
CPC ...... G01R 31/02; G01R 31/04; G01R 31/025; G01R 31/041; G01R 31/086; H04W 84/18; H02H 11/002; H02H 3/16; H02H 3/08; H04L 45/28; G08B 21/00
USPC .................................................... 361/42–50
See application file for complete search history.

(56) References Cited

U.S. PATENT DOCUMENTS

| | | | |
|---|---|---|---|
| 8,443,071 B2 | 5/2013 | Lu et al. | |
| 8,599,523 B1 * | 12/2013 | Ostrovsky | ............ G08B 21/185 |
| | | | 361/45 |
| 8,731,689 B2 | 5/2014 | Platner et al. | |
| 8,761,050 B2 | 6/2014 | Lu et al. | |
| 8,826,046 B2 | 9/2014 | Lu et al. | |

(Continued)

*Primary Examiner* — Danny Nguyen
(74) *Attorney, Agent, or Firm* — Bond, Schoeneck & King, PLLC; Frederick Price

(57) ABSTRACT

A protective wiring device disposed in an electrical distribution system, the device comprising: a plurality of line terminals comprising a line-side phase terminal and a line-side neutral terminal; a plurality of load terminals comprising a load-side phase terminal and a load-side neutral terminal; a line conductor electrically coupling the line-side phase terminal to the load-side phase terminal; a neutral conductor electrically coupling the line-side neutral terminal to the load-side neutral terminal; a controller configured to transmit wirelessly data derived from signals present on at least one of the line conductor or the neutral conductor and to receive wirelessly receive at least one command.

9 Claims, 7 Drawing Sheets

(56) References Cited

U.S. PATENT DOCUMENTS

| | | |
|---|---|---|
| 9,215,784 B2 | 12/2015 | Platner et al. |
| 9,335,750 B2 | 5/2016 | Lu et al. |
| 9,451,573 B2 | 9/2016 | Erickson et al. |
| 9,642,213 B2 | 5/2017 | Ashoff |
| 9,674,284 B2 | 6/2017 | Ding et al. |
| 9,730,144 B2 | 8/2017 | Apostolakis |
| 9,838,390 B2 | 12/2017 | Zakaria |
| 9,900,171 B2 | 2/2018 | Guedalia et al. |
| 10,004,097 B1 | 6/2018 | Somasandharam |
| 10,038,634 B2 | 7/2018 | Cheng |
| 10,075,547 B2 | 9/2018 | Kim |
| 10,075,548 B2 | 9/2018 | Kim |
| 10,142,122 B1 | 11/2018 | Hill et al. |
| 10,172,082 B2 | 1/2019 | Finnegan |
| 10,212,494 B1 | 2/2019 | Struhsaker et al. |
| 10,237,807 B2 | 3/2019 | Apostolakis |
| 2008/0007879 A1* | 1/2008 | Zaretsky ............... H02H 3/335 361/42 |
| 2010/0006469 A1* | 1/2010 | Allouche ............... B63B 32/80 206/523 |
| 2015/0006695 A1 | 1/2015 | Gupta |
| 2017/0201504 A1 | 7/2017 | Funk |
| 2018/0006961 A1 | 1/2018 | Guibene et al. |
| 2018/0097651 A1 | 4/2018 | Guedalia et al. |
| 2018/0167228 A1 | 6/2018 | Elcock et al. |
| 2018/0167392 A1 | 6/2018 | Zakaria |
| 2018/0167886 A1 | 6/2018 | Chou |
| 2018/0176079 A1 | 6/2018 | Teo et al. |
| 2018/0181094 A1 | 6/2018 | Funk et al. |
| 2018/0183685 A1 | 6/2018 | Cook |
| 2018/0184267 A1 | 6/2018 | Seo et al. |
| 2018/0247515 A1 | 8/2018 | Brady et al. |
| 2019/0019402 A1 | 1/2019 | Nachshon et al. |
| 2019/0069221 A1 | 2/2019 | Virgile et al. |
| 2019/0081503 A1 | 3/2019 | Kim |

\* cited by examiner

SMART WIRING DEVICES

CROSS-REFERENCE TO RELATED APPLICATIONS

This application claims the benefit of Provisional Application Ser. No. 62/610,738, filed on Dec. 27, 2017, the contents of which is relied upon and incorporated herein by reference in its entirety, the benefit of priority to each of these applications under 35 U.S.C. § 120 is hereby claimed.

FIELD OF THE INVENTION

This disclosure is generally related to system and methods for connecting disparate network types and to smart wiring devices.

BACKGROUND

At present, internet of things (IoT) products operate under a plethora of standards and brands that make interconnectability between IoT devices of disparate standards and brands nearly impossible. Wi-Fi systems are not capable of operating with certain mesh-based or hub systems. A user beginning with a Wi-Fi-based IoT system will be unable to port his system over to a mesh-based system, nor will the Wi-Fi-based system work with any mesh-based products in added in the future. This means that a user beginning with one system standard cannot then switch to another system without losing the investment in the first system, or be forced to use two separate applications to control the IoT devices.

Accordingly, there is a need in the art for mobility between and within connected systems, permitting a user to start with one type of network-connected product (e.g., Wi-Fi connected product) and add in another type of network-connected product (e.g., Thread-based product). Indeed, there exists a need in the art for a method for permitting disparate systems to work together beyond basic functionalities (e.g., on/off).

As many devices are becoming wirelessly connected, the capabilities of such connected devices increase. However, wiring devices that are similarly wirelessly connected have not yet broken into the market. There exists, therefore, a need in the art for smart connected wiring devices that can send, wirelessly, analytics to a user and receive from the user commands.

SUMMARY OF THE INVENTION

According to an aspect, a protective wiring device disposed in an electrical distribution system, includes: a plurality of line terminals comprising a line-side phase terminal and a line-side neutral terminal; a plurality of load terminals comprising a load-side phase terminal and a load-side neutral terminal; a line conductor electrically coupling the line-side phase terminal to the load-side phase terminal; a neutral conductor electrically coupling the line-side neutral terminal to the load-side neutral terminal; a controller, including a transceiver, being configured to transmit wirelessly via the transceiver, data derived from signals present on at least one of the line conductor or the neutral conductor and to receive wirelessly via the transceiver, at least one command.

In an example, the data is a type of fault.
In an example, the controller determines a type of fault based on at least two values representative of a polarity of a current imbalance between the line conductor and neutral conductor, a frequency of the imbalanced current between the line conductor and neutral conductor, and a presence of a fault.

In an example, the controller determines a reverse-polarity ground fault if a negative polarity current imbalance flows between the line conductor and the neutral conductor and a fault is present.

In an example, the controller determines a forward-polarity ground fault if a positive polarity current imbalance flows between the line conductor and the neutral conductor and a fault is present.

In an example, the controller is configured to determine a grounded neutral condition exists if the frequency of the imbalanced current is a value greater than 4 kHz and a fault is present.

In an example, the wiring device further includes a frequency detector configured to detect frequency values greater than 4 kHz.

In an example, the frequency detector comprises a high-pass filter in series with an input terminal of a switch.

In an example, the controller is configured to send the type of fault to a user.

In an example, the command is a reset command.

In an example, the controller is configured to disable a remote reset functionality upon a determination that the wiring device tripped from a ground fault.

In an example, the command is a test command.

According to another aspect, a protective wiring device disposed in an electrical distribution system, includes: a plurality of line terminals comprising a line-side phase terminal and a line-side neutral terminal; a plurality of load terminals comprising a load-side phase terminal and a load-side neutral terminal; a line conductor electrically coupling the line-side phase terminal to the load-side phase terminal; a neutral conductor electrically coupling the line-side neutral terminal to the load-side neutral terminal; a controller configured to determine a type of fault based on at least two values representative of a polarity of a current imbalance between the line conductor and neutral conductor, a frequency of the imbalanced current between the line conductor and neutral conductor, and a presence of a fault.

In an example, the controller determines a reverse-polarity ground fault if a negative polarity current imbalance flows between the line conductor and the neutral conductor and a fault is present.

In an example, the controller determines a forward-polarity ground fault if a positive polarity current imbalance flows between the line conductor and the neutral conductor and a fault is present.

In an example, the controller determines a grounded neutral condition exists if the frequency of the imbalanced current is a value greater than 4 kHz and a fault is present.

According to another aspect, a network of smart devices implementing disparate network standards, includes: a border router in wireless communication with at least one of a first plurality of smart devices, the smart devices being connected through a first network connection standard, the border router being configured to issue commands to the at least one of the first plurality of smart devices, wherein the border router is in further communication with an access point, the access point being in wireless communication with a second plurality of smart devices, the second plurality of smart devices being connected to the access point through a second network connection standard, wherein the border router is configured to issue commands to the access point such that the commands are sent to at least one of the second plurality of smart devices, wherein the at least one of the second plurality of smart devices is controlled by the commands issued to the access point.

In an example, the first network connection standard is a mesh-based network standard and the second network connection is a wireless local area network standard.

In an example, the border router is configured to store one or more presets, the preset being implemented by a trigger and results in sending a command.

In an example, the smart devices are configured to store and implement one or more presets.

In an example, the border router is configured to download the presets from a server.

In an example, the server is remote.

In an example, the server is a local.

In an example, the network of smart devices continues to be operational upon loss of second network connection standard.

Additional features and advantages of the invention will be set forth in the detailed description which follows, and in part will be readily apparent to those skilled in the art from that description or recognized by practicing the invention as described herein, including the detailed description which follows, the claims, as well as the appended drawings.

It is to be understood that both the foregoing general description and the following detailed description are merely exemplary of the invention, and are intended to provide an overview or framework for understanding the nature and character of the invention as it is claimed. It should be appreciated that all combinations of the foregoing concepts and additional concepts discussed in greater detail below (provided such concepts are not mutually inconsistent) are contemplated as being part of the inventive subject matter disclosed herein. In particular, all combinations of claimed subject matter appearing at the end of this disclosure are contemplated as being part of the inventive subject matter disclosed herein. It should also be appreciated that terminology explicitly employed herein that also may appear in any disclosure incorporated by reference should be accorded a meaning most consistent with the particular concepts disclosed herein.

The accompanying drawings are included to provide a further understanding of the invention, and are incorporated in and constitute a part of this specification. The drawings illustrate various embodiments of the invention and together with the description serve to explain the principles and operation of the invention.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention.

DETAILED DESCRIPTION

Figure 1:
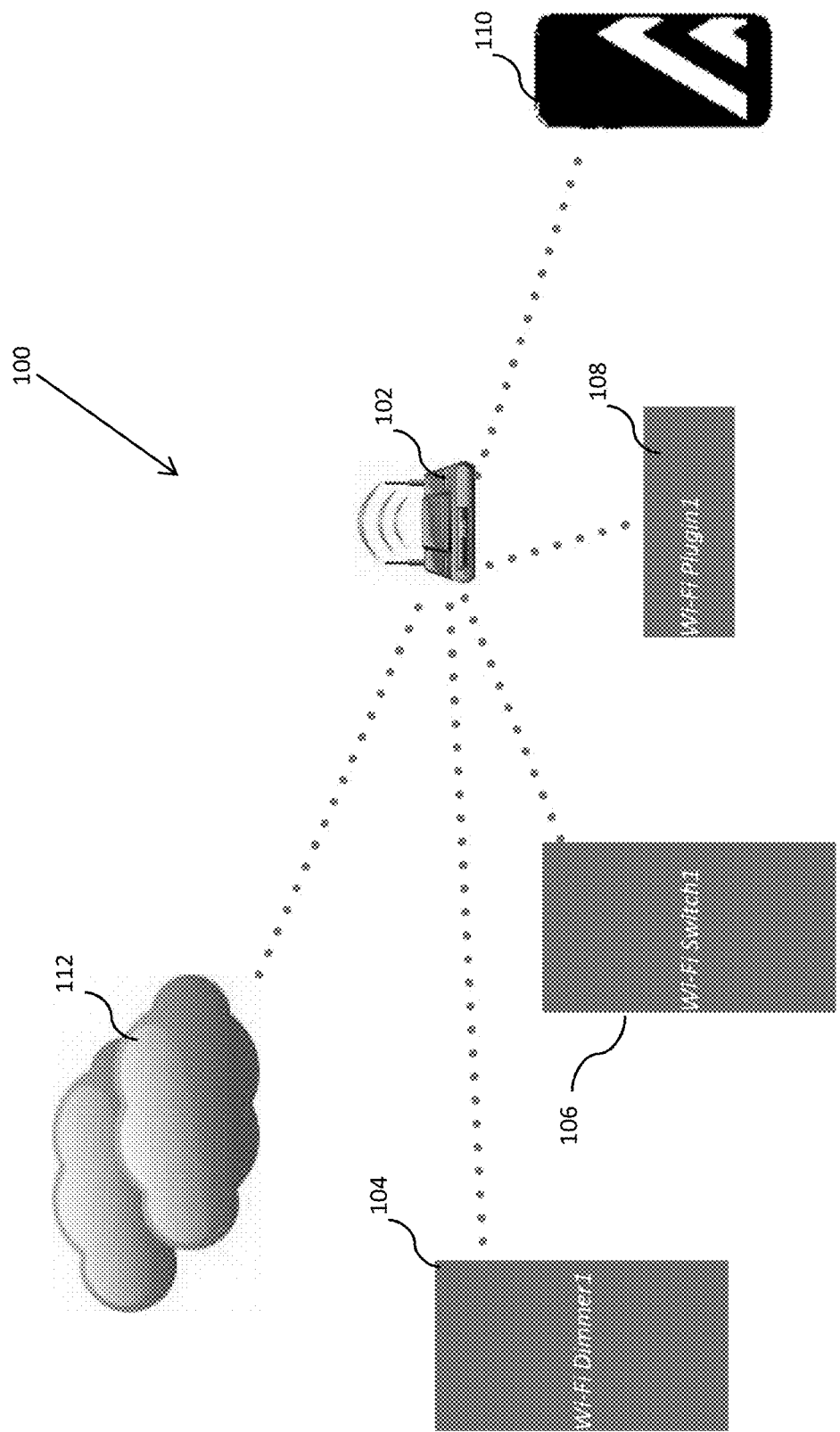
FIG. 1 is a schematic of a wireless local area network, according to an example.

Reference will now be made in detail to the present exemplary embodiments of the invention, examples of which are illustrated in the accompanying drawings. Wherever possible, the same reference numbers will be used throughout the drawings to refer to the same or like parts. FIG. 1 shows an example of a wireless local area network 100 (e.g., a Wi-Fi system) comprising an access point 102 that may be in wireless communication with IoT devices 104, 106, 108 (which may be, for example, wiring devices such a switch, dimmer, receptacle, or plugin) a control device 110 (e.g., a mobile device, computer, or other control device), and be in further communication with at least one remote server 112 (i.e., the cloud) via, for example, an internet service provider. It should be understood that the remote server, as described in this disclosure, may be alternately be local server, such as implemented in a home or office.

Internet access point 102 may be, for example, configured to communicate with the control device 110, with the one or more IoT devices 104, 106, 108, and with the internet. Such access points are known in the art, so further discussion is not warranted here.

Again, the IoT devices 104, 106, 108 may be a switch, a dimmer, a receptacle, a plugin, etc. Other IoT devices, such as Wi-Fi enabled kitchen appliances, lightbulbs, etc. are also contemplated and may be connected to and controlled by access point 102. IoT devices 104, 106, 108, in this example, are limited to the WLAN and are controlled and communicate solely through access point 102. IoT devices 104, 106, 108 may each include a chip configured for connection to the WLAN, such as a Samsung ARTIK 030, although other suitable chips are contemplated.

Control device 110 as mentioned above, may be a computer or a mobile device, such as a mobile phone, tablet, smart watch, remote control, sensor, control panel, etc. Alternately, control device 110 may be a voice-controlled smart device such as the Amazon Echo, Google Home, etc. Control device 110 may be connected to the access point 102 through either a wired or wireless connection. Examples of wired connections may include connections over a co-axial cables (MoCA) or Powerline.

In this network, control of devices may be administered through the access point 102. For example, control device 110, running, e.g., a control application, may control IoT device 104, 106, 108 through wireless communication with access point 102. Control device, through the control application, may send a command to access point 102, which, in turn, sends a command signal to each device connected over the wireless network. Example commands may include on or off, dim, test, or reset, although other commands are contemplated. Control device 110 may alternately send commands via the cloud, if control device 110 is not connected to the wireless local area network. For example, control device 110 may (e.g., through a cellular internet connection) issue a command to a remote server, which, in turn, issues a command to access point 102 to control device 110. Additionally, edge devices could be things like sensors or cameras which can send data to other edge devices to take action on, or through a cloud to interoperate with other products.

In such a network, scenes (i.e., presets) may be stored in the cloud and implemented through the access point 102. Scenes may, for example, be manually triggered, such as through control device 110 or via a button, or may be automatically triggered, for example, at a predetermined time. Other types of triggers may include location, or sensor-based triggers like motion, or light level, or sound. For example, a user may implement a particular preset (e.g. all devices off) through the control application, and, in response to the command issued from the control device 110, the cloud may retrieve the scene from memory and send a command to access point 102 to implement the scene. This method requires that the particular scenes, or at least the representations of the scenes (e.g., scene names) be stored on the control device 110. One such cloud service is the Samsung Artik Cloud, although others are offered and contemplated.

In an alternate example, scenes may be stored on the access point 102 itself, but be implemented in a similar manner. For example, control device 110, located on the local wireless network, may send a command to access point 102, which retrieves the scene from memory and sends the requisite commands to IoT devices 104, 106, 108 in order to implement the scene. While many currently-available access points do not include the capability of storing and implementing scenes—instead functioning to route data to, e.g., IoT devices 104, 106, 108—it is contemplated that this capability is a natural outgrowth of such an access point.

In another example, the scene information may be stored on IoT devices 104, 106, 108 themselves and retrieved in response to a particular command (e.g., a command to recall scene 1). In an alternate example, the settings necessary to implement the scene may be stored in the cloud or on the access point 102. In the latter example, IoT devices 104, 106, 108 do not store setting information for the individual scenes, but rather only respond to commands received from access point 102 (in an example, originating from cloud 112 or from control device 110) tailored to implement a particular scene. In a variation of this example, IoT devices 104, 106, 108 may store and implement the various scenes without additional input from the cloud or access point. In other words, individual IoT devices 104, 106, 108 may store a particular time-triggered scene, and implement that scene at the proper time without receiving a command, permitting scenes to operate even if the network malfunctions (e.g., the access point 102 is disconnected or malfunctions). It should be understood that variations and combinations of examples described above in connection with wireless local area network 100 are contemplated and within the scope of this disclosure.

Figure 2:
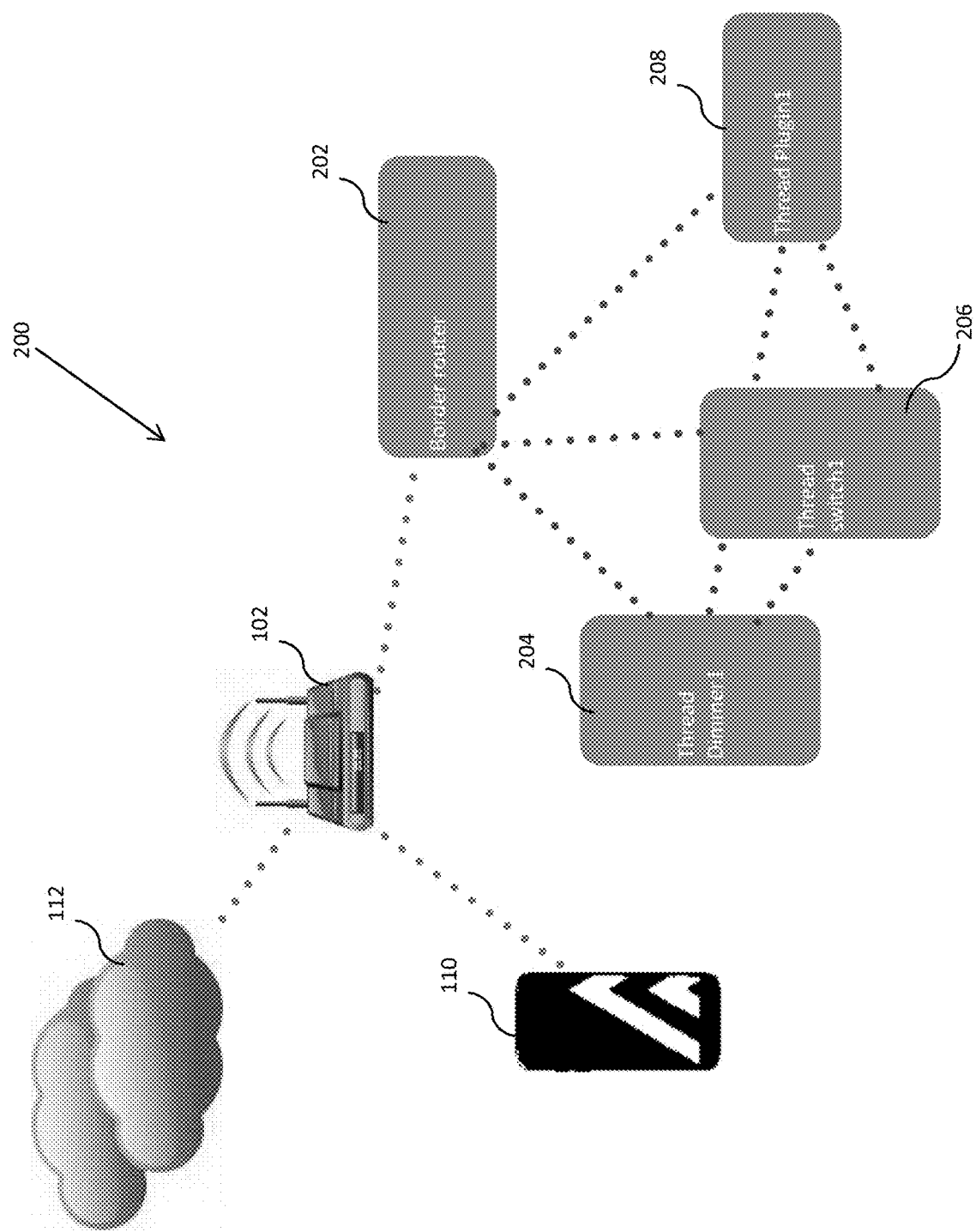
FIG. 2 is a schematic of a mesh-based network, according to an example.

FIG. 2 depicts a mesh-based network 200, implemented, for example, with a standard such as Thread, Zigbee, Bluetooth Mesh, etc. In such a mesh-based network, a plurality of IoT nodes 204, 206, 208 form a network for transmitting packets or other information throughout the network, allowing such network to self-configure and self-heal in case a particular is disconnected or malfunctions. IoT nodes 204, 206, 208, may, for example, be devices such as a dimmer, a switch, receptacle, or plugin. Various methods and systems for creating such mesh networks are known in the art, and thus do not merit further discussion here.

As shown in FIG. 2 mesh network 200 may include a border router 202 in wireless communication with one or more of IoT nodes 204, 206, 208 and access point 102. Border router 202 may facilitate communication between the nodes in the mesh network 200 and the cloud, via access point 102 and, e.g., an ISP. In addition control device 110, in communication with access point 102, may issue commands to IoT nodes 204, 206, 208 in mesh network via access point 102. Border router 202 may, for example, be any device operating under the necessary standard for a border router 202. For example, in a Thread-based network, the border router 202 operates under the Thread standard for a border router. One such border router is the DSH-G300-TBR offered by D-Link, although other border routers are offered and are contemplated.

IoT nodes 204, 206, 208 may each include a chip configured for connection to the mesh network, such as a Samsung ARTIK 053, although other suitable chips are contemplated. Similar to the IoT devices 104, 106, 108 (discussed in connection with FIG. 1), the IoT node may be a switch, a dimmer, a receptacle, a plugin, etc. Other IoT nodes, such as mesh-network enabled kitchen appliances, lightbulbs, etc. are also contemplated and may be connected to and controlled by access point 102. IoT devices 104, 106, 108, in this example, are limited to the mesh-based and are controlled and communicate only with the border router 202 and with each other.

Control device 110 as mentioned above, may be a computer or a mobile device, such as a mobile phone, tablet, smart watch, remote control, sensor, control panel, etc. Alternately, control device 110 may be a voice-controlled smart device such as the Amazon Echo, Google Home, etc. Control device 110 is, again, connected to the access point 102 over the WLAN standard.

Mesh network 200 may store and implement scenes, by storing scenes in border router 202. Scenes may be implemented, like in the WLAN 100, in response to a manual or automatic trigger. Border router may send the command to IoT nodes 204, 206, 208, implementing the scene in response to the trigger. Border router 202 may additionally store all scene states for each IoT node 204, 206, 208, (e.g., on/off state, trip/reset state, etc.) acting as a proxy for each individual node. Alternatively, the scene may be stored in the cloud and executed locally via border router. In yet another embodiment, the scenes may be stored on individual devices and implemented via a command by the border router (the command, in an example, may originate with the cloud), or in the case of a time-triggered scene, the scene may be implemented by IoT node 204, 206, 208 at the proper time and without additional input.

In any of the above examples, the scenes may be configured or manually executed using control device 110 in communication with access point 102 and/or cloud 112. It should be understood that variations and combinations of examples described above in connection with mesh network 200 are contemplated and within the scope of this disclosure.

Figure 3:
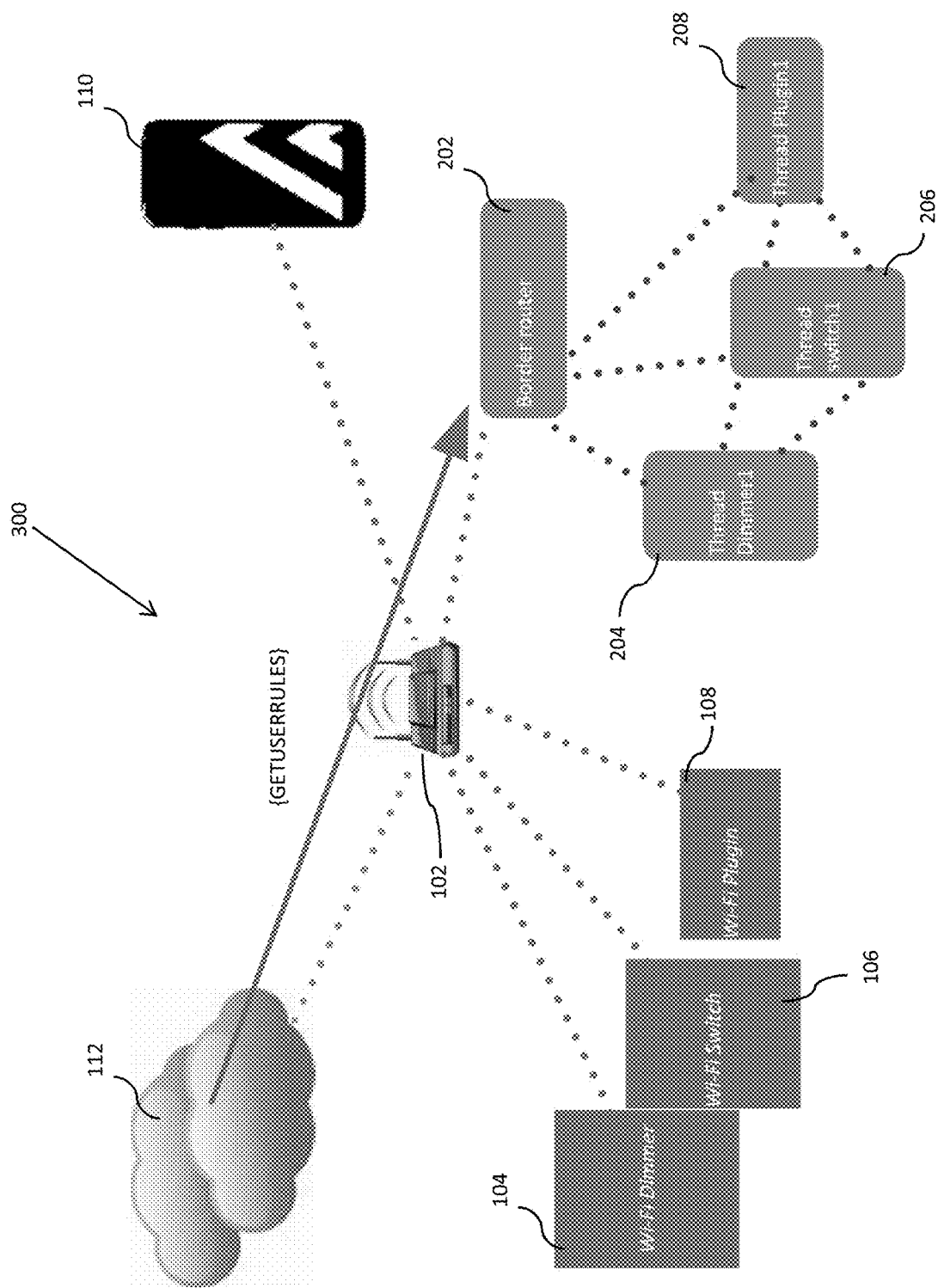
FIG. 3 is a schematic of an integrated network, according to an example.

There is shown in FIG. 3 an integrated wireless local area and mesh network, according to an example. In the example shown, multiple types of devices respectively configured for one type of network are controlled through an edge device or hub that is further configured to communicate with a hub or edge device of another type of network, and, in doing so, control devices of both network types.

In the integrated system shown in FIG. 3, border router 202 manages entire network. When controlling IoT nodes 204, 206, 208, border router 202 operates in the manner described in connection with FIG. 2. When controlling IoT device 104, 106, 108, border router issues a command to IoT device 104, 106, 108, via access point 102. In this way, border router 202 is able to control devices of both networks, and the networks are effectively integrated into a single controllable network. As a result, control device 110, e.g., through a control application, may also control and receive, for example, analytic information, from devices connected to both networks.

Furthermore, by integrating the WLAN and mesh-based system, a user beginning with one type of system may upgrade or otherwise combine another type of system. For example, if a mesh network 200 is added to an established wireless local area network, border router 202 may adopt the authoritative role by copying scenes from cloud or wherever else scenes are stored. Scenes stored on the cloud may be copied to the border router 202 and any future scenes may be stored in both the border router 202 and the cloud for redundancy. Alternately, if a wireless local area network is added to an established mesh network, the wireless local area network, during boarding process, may note from the cloud that the local border router is the authoritative scene server.

In an alternate embodiment, scenes may be copied from the border router 202 to the access point 102 or to the cloud 112, with either adopting the authoritative role in the integrated network for administering scene commands. In yet another embodiment, scenes may be divided between or stored in multiple places, with the authoritative role distributed between multiple devices (e.g., distributed between the access point 102 and the border router 202).

It should be understood that, although an integrated WLAN and mesh-based network is shown, other types of disparate networks may be similarly combined. For example, two mesh-based networks, each including a border router configured to communicate over a particular standard, e.g., Zigbee and Thread, may be configured to communicate with each other, with one border router adopting an authoritative role, or the authoritative role being distributed between the border routers. Again, scenes may be copied from the cloud or from the other device to one border router, or distributed between the border routers. Furthermore, it should be understood that variations and combinations of examples described above in connection with mesh network 200 are contemplated and within the scope of this disclosure.

As mentioned above, IoT devices 104, 106, 108 and IoT nodes 204, 206, 208 are smart devices, and can include devices such as dimmers, switches, or receptacles. Such devices may include a controller that is configured to be in either wired or wireless communication with a network. As such, controller (examples of which are the Samsung Artik 030 and Samsung Artik 053, as described above) may include a transceiver for transmitting and receiving data wirelessly. Controller, as used in this disclosure, should be understood to encompass circuitry, including a transceiver, configured to receive wireless commands, to transmit wireless data, and interpret conditions necessary to transmit wireless data (such as, e.g., determining the on/off position of a switch, whether current is flowing through a switch, the type of fault occurring at a GFCI receptacle, etc.) and to implement received commands (e.g., turn a switch off, to dim a dimmer, to implement a remote test or reset of a GFCI receptacle, etc.). In addition, other protective devices may be implement, such as TVSS and AFCI.

In addition, controller may be configured for communication with a Wi-Fi network, a Thread network, a Zigbee network, Bluetooth Mesh network, etc. To the extent that controller is configured to implement a Wi-Fi or Thread communication protocol, it may be necessary to define an application layer, as these protocols do not specify one. One such application layer may be in accordance with an open application-layer framework, such as defined by the Open Connectivity Foundation, permitting communication between disparate IoT devices/nodes developed for these communication protocols by different manufacturers. In an alternate embodiment, controller may communicate directly with a user via medium besides a network connection. Such communication may be wired, e.g., through connection through a USB or Ethernet port, or direct wireless, e.g., via a local Bluetooth connection.

As such, as appropriate and suitable for the particular application, controller may be implemented as a microcontroller with the wireless transceiver integrated, as a microcontroller in communication with a separate wireless transceiver, or as a dedicated hardware (e.g., an Application Specific Integrated Circuit instead of a microcontroller) in communication with the wireless transceiver. In any addition, controller may be implemented as a multiple of the above or a combination of the above (e.g., a wireless transceiver in combination with multiple microcontrollers, or with a microcontroller in combination with dedicated hardware, or multiple microcontrollers in combination with dedicated hardware). Furthermore, controllers may implement firmware/software and may include a non-transitory storage medium programmed to carry out the various methods and algorithms described herein.

As described above, and in one example, IoT switches, dimmers, and receptacles may include at least two microcontrollers/dedicated circuits operating together: one microcontroller, for example, performs the necessary communication (e.g., for transmitting data and receiving commands, via transceiver, in accordance with a protocol such as Thread or Wi-FI) and the other microcontroller/dedicated circuity performs endpoint specific functions (e.g., switch, dim or protect and interrupt). For example, when the switch on the face of the switch is pressed, the communication controller (e.g., the Artik 053) may decide when to actuate the switch, in which direction, and communicates a state-change to the border router, whereas the endpoint microcontroller/processor reads pushbuttons, communicates bi-directionally with the Artik 030, sets the output voltage to the lighting load, and controls the indicator LEDs. In the dimmer example, the endpoint microcontroller/processor may control the timing functions of the dimmer, which may difficult to perform on the same microcontroller performing the communication.

An example implementation of one such IoT device/node is a IoT dimmer and IoT switch. These categories of devices may include, for example, a plug-in dimmer, plug-in switch, in-wall dimmer, or in-wall switch. An implementation of such devices is discussed in Provisional Application Ser. No. 62/610,738, filed on Dec. 27, 2017, to which this application claims priority, and in which a Wi-Fi example is provided on pages 21-31 herein incorporated by reference (to avoid confusion, this section begins with the title "Pass & Seymour Overview of Electronics for Wi-Fi Dimmer and Switch Products"), a Thread example is provided on pages 32-47 herein incorporated by reference (to avoid confusion, this section begins with the title "Pass & Seymour Overview of Electronics for Thread Wiring Devices"), and example views and component listings are provided are pages 52-56 and 59-67, herein incorporated by reference.

As mentioned above, control device 110 may implement a control application (e.g., via a user interface on control device 110 such as a screen or voice-control) that permits user control of IoT devices/nodes and may receive data from the one or more IoT devices/nodes. For example, in the example of an IoT switch, the control application may send commands (e.g., via cloud, local network, etc.) to turn on/off, and may receive and display to the user the state (on/off) of the IoT switch. Similarly, in the example of the IoT dimmer, the control application may set a dimming level, and may receive and display to the user the state (dimming level) of the IoT dimmer. In the example of the GFCI device (which may be implemented, e.g., as a wall-receptacle or outdoor GFCI) the control application may send commands such as remote test, remote reset, and auto-monitoring, and may receive data such as reset/trip state, a fault occurrence, the type of fault occurring, and whether a miswire state has occurred. In the case, of a fault or miswire state, control application may not only notify a user of a type of fault, but may also provide information on the cause of the fault and guidance on how to fix the condition causing the fault (for example, if a miswire has occurred, the application may provide guidance on how to wire the device properly). IoT devices/nodes may also send additional diagnostic information such as temperature, power consumed by a load, current flowing through the IoT device/node to a load, voltage at the load, etc. The diagnostic information may either be interpreted at the IoT device/node or may be sent as raw data which may be interpreted in the cloud or control application. In another example, a GFCI or AFCI may provide power fingerprinting, where characteristics of the circuit are reported to the control center accessible by the user. These characteristics for example may include arc activity, line characteristic, voltage source health, statistics on surge or loss events, load consumption. As described earlier, having access to a larger display (i.e. smart phone, computer, etc.), there are greater possibilities to the amount of information that can be sent to the user as well as control and monitoring capabilities on a system level. Having the external and separate or remote display also frees up room on the smart device itself. For example, it may not be necessary to indicate on the smart device the status of the smart device, for that information is now available at other locations (mobile device, cloud, etc.).

In addition to the above, IoT devices/nodes may send diagnostic data to a manufacturer to aid in the preparation of updates (e.g., locally implemented or implemented over-the-air) to fix bugs. For example, IoT GFCI device may send information related to nuisance trips to a manufacturer to aid in the preparation of an update the helps to reduce the occurrence of nuisance trips.

Multiple IoT devices/nodes may be connected in series or otherwise networked together to create a subsystem. This series combination may be controlled through a control device or via the cloud as a unit. As an example, a series sub circuit may involve placing a smart switch downstream from a smart GFCI. Multiple IoT devices allow for additional control and identification of loads within the system. This identification and control creates potential ease for mapping loads to the circuit panel.

Figure 4A:
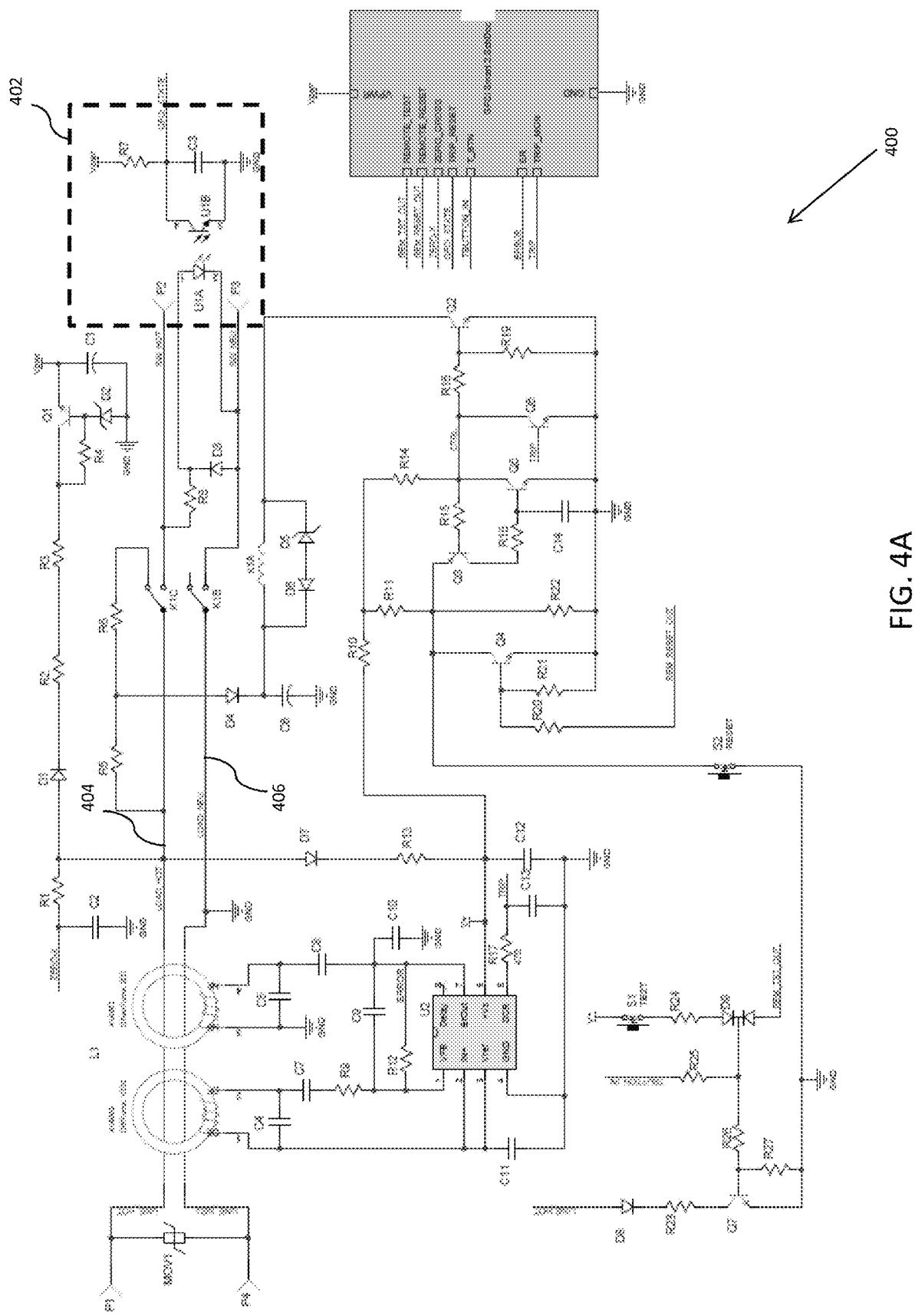
FIG. 4A is a circuit schematic of a smart wiring device, according to an example.
Figure 4B:
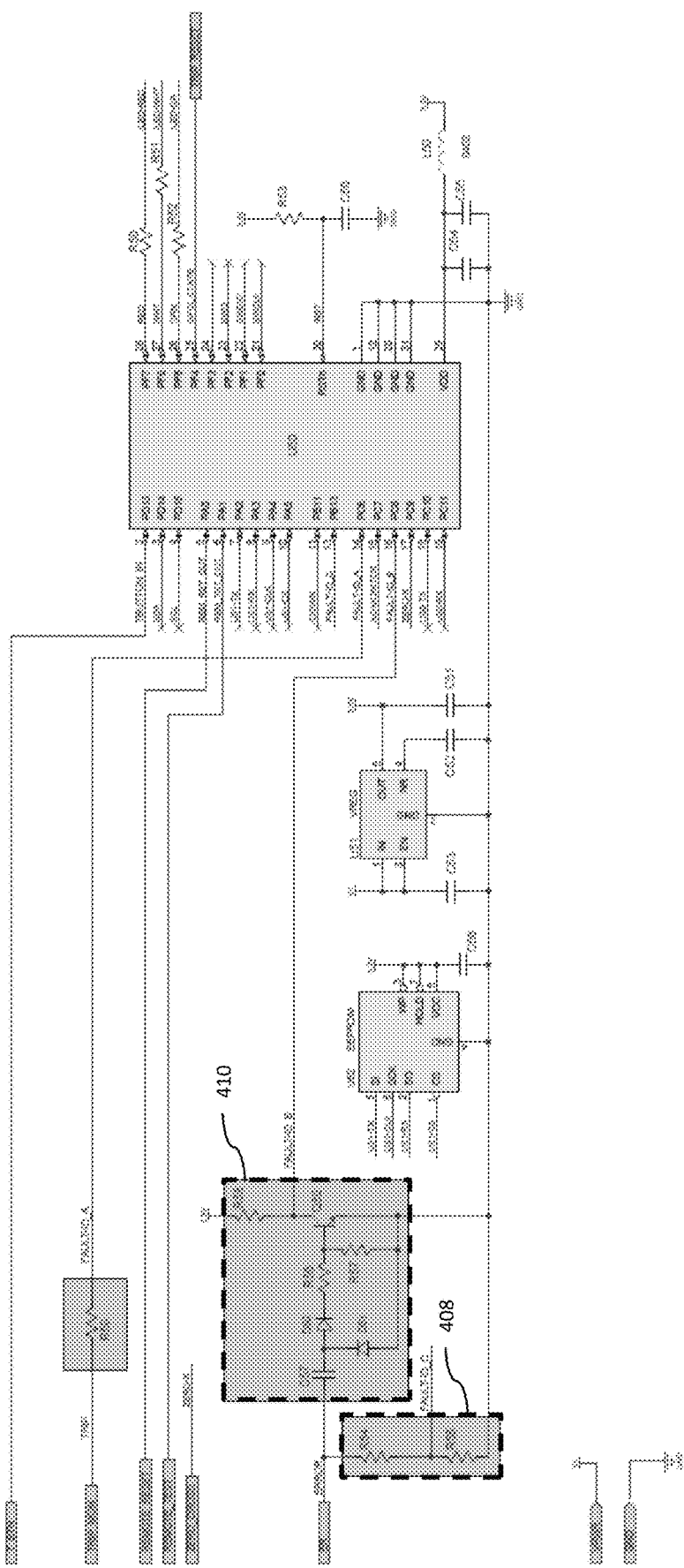
FIG. 4B is a circuit schematic of a smart wiring device, according to an example.

An example circuit schematic of a receptacle, wiring device 400, (which may be, e.g., a wall receptacle or outdoor GFCI) is shown in FIGS. 4A and 4B. As shown, wiring device 400 includes a controller U50 configured to be in either wired or wireless communication with a network. As described above, the network may be a wireless local area network, a mesh network, or any other kind of suitable network. Controller U50 may thus be configured for communication with a Wi-Fi network, a Thread network, a Zigbee network, Bluetooth Mesh network, etc.

As shown, when differential transformer L1 senses unequal amounts of current flowing in the hot and neutral conductors due to a ground fault condition, wiring device 400 causes a breaker coil K1A to activate, opening circuit interrupting mechanism K1B, K1C. The circuit interrupting mechanism K1B, K1C is configured to establish and break connectivity between the hot and neutral AC power lines, and the hot and neutral load lines, respectively.

Further, wiring device 400, as shown, includes line-side terminals comprising a line phase terminal P1 and a line neutral terminal P4. Opposite the line-side terminals are the load-side terminals including load phase terminal P2 and load neutral terminal P3. Line phase terminal P1 is connected to load phase terminal P2 by line conductor 404. Similarly, line neutral terminal P4 is connected to load phase terminal P3 by neutral conductor 406. A pair of separable contacts K1B, K1C is respectively positioned along the line conductor 404 and neutral conductor 406 to break the connection between the line-side terminals and the load-side terminals.

Separable contacts K1B, K1C may be implemented as an electromechanical device, and any known interrupting contacts may be used to separate the line terminals from the load terminals. One such set of interrupting contacts, the electromechanical device that supports their operation, is taught in U.S. Pat. No. 9,437,386 directed to a "Protective Wiring Device," the entire disclosure of which is incorporated herein by reference.

In an example, controller U50 is a Samsung Artik 030 (Thread) or 053 (Wi-Fi), although other suitable controllers may be used. Controller U50 itself need not be one controller, but rather may be implemented by multiple processors (including, e.g., microprocessors), dedicated hardware, firmware, and/or software, acting alone or in concert to carry out the functions described in this disclosure. Controller may include a non-transitory storage medium for storing program code necessary to carry out the steps of the methods described in this disclosure.

As described above, controller U50 may communicate analytics to a user and may receive from the user commands, via, e.g., control application implemented on control device 110. Such analytics may include, for example, the occurrence of a fault and/or the type of fault having occurred, trip/reset state, input voltage, power consumption, temperature, etc. The user receiving the analytics may be, for example, a consumer, a technician servicing the wiring device, or a manufacturer. The analytics may be sent or pulled to a control device, such as control device 110 (e.g., a computer or mobile device running a control application) or the cloud, where it may be accessed by anyone with a requisite account with a cloud host, or by a manufacturer (indeed, the cloud may be a manufacturer's remote server).

The analytics may be raw data (e.g., measured voltages or currents) that are interpreted outside of wiring device, or may be interpreted by controller U50 (e.g., fault type, etc.) before being sent/pulled to a control device or the cloud. In order to interpret data, controller U50 may store enough information to perform the requisite diagnostic tests. Storing such information may occur in the form of storing a running window of data received over a running predetermined interval. The data, however, may be stored in any other fashion suitable for carrying out continuous or periodic diagnostic tests described in this disclosure.

Controller U50, as mentioned above, may receive commands from control device 110 and/or the cloud. Such commands may be, for example, reset or test commands, on/off commands, and/or dimming commands; however, other commands are contemplated.

It should be understood that the below descriptions in connection with FIGS. 4A and 4B are merely provided as examples of one wiring device implementation and that other wiring device implementations are contemplated and within the scope of this disclosure. Furthermore, to the extent that controller U50 or dedicated circuitry are shown, it should be understood that various functions may be distributed differently between controller U50, the dedicated circuitry, the cloud, and/or an application such as control application operating on control device 110.

As described above, controller U50 may determine the trip/reset state of wiring device 400. The trip/reset state may be determined according to the output of state detection circuit 402 shown, in an example, in FIG. 4A. State detection circuit 402 may be configured to output a first signal indicative a trip state and a second signal indicative of a reset state.

As shown in FIG. 4A state detection circuit 402 may, in an example, include an optocoupler, including a diode side U1A and a phototransistor side U1B. The anode of the diode side U1A of the optocoupler may be connected to the load side of line conductor, while the cathode may be connected to the load side of the neutral conductor. The collector of the phototransistor U1B side be connected to a controller U50 input GFCI_STATE and to pull-up resistor R7, which, in turn, is connected to DC voltage source vpwr. The emitter of the phototransistor side U1B may be connected to ground.

During operation, if wiring device 400 is in a tripped state, diode side U1A will not conduct and GFCI_STATE output will be pulled high (e.g., first signal) by pull-up resistor R7 and DC voltage source vpwr.

In the reset state, the diode side U1A will conduct during the positive half-cycle of the voltage present at load hot terminal P2. As a result, phototransistor side U1B will also conduct, tying pull-up resistor and GFCI_STATE output to ground. During the negative half-cycle, diode side U1A will not conduct and GFCI_STATE output will be pulled high again. Thus, while wiring device 400 is in the reset state, the output of state detection circuit 402 will transition from low to high during each cycle in a square-wave pattern (e.g., second signal).

One of ordinary skill in the art will appreciate, in conjunction with a review of this disclosure, that state detection circuit 402 may be implemented in a variety of ways including the example provided in FIGS. 4A-4B. For example, state detection circuit 402 may be used as a pull-down, rather than a pull-up resistor, reversing the values of the example first output and second output. In another example, state detection circuit may be replaced by a digital or analog buffer that yields no output when the device is tripped and an alternating output when the wiring device is in a reset state.

In yet other examples, the state detection circuit 402 may be replaced setting a flag, implemented, for example, in controller U50, that changes each time test is triggered or a fault occurs, and changes again each time wiring device is reset. The state detection circuit 402 output may be supplied to and received by controller U50. As described above, controller U50 may communicate this state to a user.

Thus, the state of wiring device 400, using a circuit such as state detection circuit 402, may be supplied to a user. The state of wiring device may further enable or disable certain features, such as the remote reset or test feature—which may be only enabled in the tripped and reset states, respectively.

Controller U50 may permit user to remotely test the wiring device via, e.g., control device 110 via a local network, or remotely, via the cloud. The remote test may occur using an output, such as REMOTE_TEST output, outputting the REM_TST_OUT signal, from controller U50, shown in FIG. 4B.

As shown in FIGS. 4A-4B, remote test may trigger the test function in wiring device in a manner similar to conducting a local test (e.g., through a button press, the button being located on wiring device 400). For example, to locally test wiring device 400, test button S1 is pressed by a user. Test button S1 connects V+ to the base of transistor Q7 through R24, R26, and D9, turning transistor Q7 on and shunting current from LINE HOT directly to ground. This presents a ground fault, effecting a current imbalance between the HOT and NEUTRAL conductors, tripping wiring device 400 (as long as wiring device 400 is properly functioning).

Likewise, as shown in FIGS. 4A-4B, remotely testing wiring device 400 works in substantially the same way: REM_TST_OUT signal is used to control the base of Q7, shunting current from LINE HOT directly to ground and creating a current imbalance between the HOT and NEUTRAL conductors. This may be accomplished, as shown, by connecting both test button S1 and REMOTE_TEST, effectively, to the base of transistor Q7, via independent diodes D9. Independent diodes D9 serve as an OR gate, and are connected together at their cathodes, to permit the signals from V+ and REM_TEST_OUT to be input through the D9 anodes to control transistor Q7 without interference.

It should be understood that other methods of remotely testing wiring device 400 may be employed, and that the embodiment shown in FIGS. 4A-4B is merely provided as an example of one such method. Most methods of testing a wiring device rely on shunting current away from the HOT or NEUTRAL conductor to simulate a fault. Controller U50 may similarly cause current to be shunted from the HOT or NEUTRAL conductor in way suitable for testing wiring device 400.

Controller U50 may be configured to auto-monitor (e.g., to determine an end-of-life condition) wiring device 400 by performing scheduled tests. Such tests may be implemented on a scheduled defined by a user (e.g., through a control device 110 application) and triggered via the cloud or locally by controller U50 (upon which the schedule may be stored). For example, a user may, via control device 110, set an auto-monitoring test to commence every night at 10:00 pm. This schedule may be stored in the cloud, which, every night at 10:00 pm sends a command to wiring device 400 to implement a test. Alternately, this schedule may be stored in memory at controller U50, which may implement the test at the required time.

Controller U50 may also be configured to detect a miswire condition. In one example, after a trip has occurred, if the wiring device is in a miswire condition, wiring device 400 will become nonresponsive and cease to be powered. In this case, controller U50 may detect, for example, that power may be denied to it in short course, and may notify the user, via, e.g., the cloud and control application on control device 110, that wiring device is in a miswire state. In an alternate example, if controller U50 is otherwise powered, controller U50 may detect a lack of communication/signals with other aspects of wiring device 400, such as controller U1, and may determine that a miswire condition has occurred, again notifying user. In yet another example, a remote server may cease to receive communications from wiring device 400, and may notify user that wiring device 400 has become nonresponsive, which may indicate a miswire state.

In addition to auto-monitoring and miswire detection, controller U50 may be configured to implement other safety protocols in accordance with UL-943.

After a trip occurs, a user may remotely reset wiring device 400, device via, e.g., control application on control device 110 through a local network, or remotely, via the cloud. Remote reset may occur using an output from controller U50. For example, as shown in FIG. 4A-4B both RESET button S2 and controller U50 output REM_RESET_OUT may pull the emitter of transistor Q3 low, resetting wiring device 400. In the first case, RESET button S2 directly ties the emitter of Q3 to ground. In the second case, REM_RESET_OUT turns transistor Q4 ON via resistor R20, tying the emitter of Q3 to ground. In either case, the action of pulling the emitter of transistor Q3 low enables the reset function of wiring device 400.

It should be understood that other methods of remotely reset wiring device 400 may be employed, and that the embodiment shown in FIG. 4A-4B is merely provided as an example of one such method. Most methods of resetting a wiring device will involve energizing an inductor, such as inductor K1A, in order to reset switches K1B or K1C (or other similar structure for creating a discontinuity between line and load side of wiring device 400). Controller U50 may thus similarly energize inductor K1A (or similar inductor), in other examples, to cause a remote reset.

Controller U50 may distinguish between faults that occur during the course of operation (e.g., ground fault or nuisance trips) and faults that occur due to user intervention (e.g., test button press or remote test). Some standards require that remote reset only be possible if intentionally triggered, such as through the press of a test button or a remote test. One such standard is Underwriters Laboratory (UL) UL943, which requires that GFCI devices tripped by a ground fault prevent remote reset. It is thus necessary to determine, prior to allowing a remote reset, whether the device is in the trip state as a result of a ground fault or an intentional (remote or local) trip action.

In an example, as shown in FIGS. 4A-4B, any signal input to the base of transistor Q7 will be input, will send a TBUTTON_IN signal to controller input T_BTN. This notifies controller U50 that a trip has occurred, either as a result of a test button S1 press or a signal from REMOTE_TEST output of controller. In both cases, controller U50 will allow remote reset because the trip was an intentional action by the user. However, in the case of a ground fault, where an input to TBUTTON_IN is not accompanied by a command from S1 or REMOTE_TEST, controller U50 will disallow remote reset because the trip occurred as a result potentially hazardous condition.

In another embodiment, disabling remote reset may not occur within controller, but may be implemented in control application on control device 110 or in the cloud 112, which may, using software, disable the remote reset command once a ground fault has been reported. In addition, a voting routine may be implemented, where multiple voters/inputs, received, for example, from controller, an application running on the cloud, and/or the control device (and other possible communication devices), decide if a device should be switched on/off or a protective device should be reset. It is also contemplated for a communication to occur between multiple inputs to arrive at a decision. These inputs could be from controller, an application running on the cloud, and/or the control device (and other possible communication devices).

Controller U50 may be configured to interpret at least one signal of wiring device 400 in order to determine a type of fault. For example, controller U50 may be configured to determine whether a reverse-polarity ground fault, a forward-polarity ground fault, or a grounded neutral fault has occurred. Controller U50 may further be configured to distinguish between temporary noise and a fault.

As mentioned above, controller U50 may determine the type of fault by interpreting signals derived from the line and neutral conductors. Such signals may, for example, include the polarity of the current imbalance between the HOT and NEUTRAL conductors and the frequency of the imbalanced current in the HOT and NEUTRAL conductors. Both of these values may be measured using the voltage across the secondary winding of L1; however, other methods of measuring these values (e.g., with a shunt) are contemplated.

As shown in FIG. 4A, the current imbalance or frequency of the imbalanced current may be determined using the value of EROUT pin 1 of U2, which amplifies the voltage across the secondary winding of L1. The amplifier, here internal to U2, may be implemented externally, or as part of controller U50. Alternately, controller U50 may be configured to interpret the voltage across the secondary winding of L1 without amplification.

Controller U50 may further determine the type of fault according to a preliminary determination of whether a fault has occurred. The method of determining whether a fault has occurred is generally well-known and can be determined in any number of ways—as such, a thorough discussion is not warranted here. Most ground-fault interruption chips available on the market, for example, are configured to determine whether a fault has occurred, based on the voltage of the secondary winding of at least one of toroids L1. For example, the R4141A low power ground fault interrupter chip, or the FAN4149 ground fault interrupter chip, offered by Fairchild Semiconductor, are configured to determine whether a fault has occurred and to output, in response, a drive signal to the gate of an SCR. The SCR drive signal of an RV4141A chip, FAN4149 chip, or any comparable chip, may thus satisfy this requirement. Such a chip is shown in FIG. 4A as U2, having an SCR output at pin 5. However, it should be understood that the occurrence of a fault may be determined according to other methods or other components. For example, controller U50, or other similar controller, may be configured to receive the inputs from the secondary winding of toroids L1 and to determine itself whether a fault has occurred.

Controller U50 may receive these signals (e.g., current imbalance, current imbalance frequency, and ground fault detection signals) via intermediate circuits that condition these inputs for interpretation by controller U50. Intermediate circuits include, for example, resistor R59, voltage divider 408, and pulse frequency detector 410. The outputs of these intermediate circuits are received and interpreted by controller U50 in order to determine the kind of fault that has occurred. It should be understood that these intermediate circuits are determined, in part, by the nature of the inputs to controller U50, and the functions performed by the circuits may be assumed, in alternate embodiments, by controller U50, the cloud, and/or the remote application.

Each of these intermediate circuits will be briefly discussed in turn. Resistor R59 and voltage divider 408 function to condition the magnitude of the output of the SCR output and error amplifier output of U2, respectively.

The input to controller U50 from SCR out pin 5 of U2 is directed through resistor R59 before being input as FAULT_ID_A to controller U50. Controller U50, from the input, is configured to determine whether a fault has occurred. Represented digitally, SCR output (usually about a 3 V output) may be interpreted as a 1 within the controller U50, meaning that a fault has registered as occurring. Conversely, no output from SCR (e.g., 0 V) may be interpreted to as a 0. The conversion of the SCR output may be accomplished with an analog comparator internal to controller U50. Alternately, the analog comparator may be implemented outside controller U50. In yet another embodiment, the output of SCR may be interpreted as a range of values, such as with an A/D converter.

Controller U50 may be configured to receive as an input the output of a high-frequency detector circuit that is configured to output a value representative of instances at which the frequency of the current imbalance exceeds a predetermined threshold. Here, the frequency range of interest is typically between 4-6 kHz, although other ranges are contemplated.

One example of such as a circuit is pulse frequency digitizer, shown in FIG. 4B—that is, the circuit configured to detect and generate a signal each time the frequency of the current imbalance exceeds a certain frequency for a predetermined period of time. Pulse frequency digitizer may receive the output of EROUT pin 7, which again, outputs an amplified value of the voltage across the secondary winding of L1, representative of the magnitude of the current imbalance between the LINE and NEUTRAL conductors.

As shown, pulse frequency digitizer 410 may comprise, in an example, a high-pass filter (comprising, e.g., capacitor C57) in series with a rectifier (comprising, e.g. a diode D50), a voltage divider (comprising e.g., resistors R56 and R57), and a transistor (comprising, e.g., transistor Q50). As shown, the collector of transistor Q50 may be tied to a DC voltage source via pull-up resistor R58 and the input to controller U50.

Capacitor C57 functions, in part, as a high-pass filter, cutting out low frequency and DC input values. The output of high-pass filter will thus be much more attenuated for any values beneath the cutoff frequency of the high-pass filter. As described above, the cutoff frequency of the high pass filter (e.g., the value of capacitor C57) may be selected such that frequencies, e.g., less than 4 kHz are filtered. (In alternate embodiments, high-pass filter may be implemented using other known topologies.)

The output of high-pass filter is input to transistor Q50 via the conditioning circuit comprising the rectifier and voltage divider. Conditioning circuit (briefly described in more detail below) conditions the voltage input to transistor Q50 such that frequencies above the cutoff create a voltage at the base of transistor Q50 larger enough to turn transistor Q50 ON. Turning transistor Q50 ON ties in input to controller U50, FAULT-ID_B input, to ground—pulling it low. Conversely, when the frequency is below the cutoff frequency, the voltage at the base of Q50 is attenuated, the transistor Q50 remains OFF and the FAULT-ID_B input remains high via pull-up resistor R58 and DC voltage 3.3V.

The output of the pulse frequency detector will thus be digitized to a 0 or 1—a 0 representing a frequency value of greater than approximately 4 kHz, and 1 representing a frequency value of less than approximately 4 kHz. It should be understood that 4 kHz is merely provided as an example and a frequency detector may be set to other values that are useful for determining the nature of a fault. In the example embodiment depicted in FIG. 4A-4B a 4 kHz frequency value was found a useful value for determining the type of fault.

Conditioning circuit, comprising rectifier D50 and voltage divider R56, R57 are used to condition the input of transistor Q50, such that the requisite digitization occurs for the frequency values below and above the cutoff frequency.

As mentioned above, other methods of determining a frequency may be used—pulse frequency detector is merely provided as one example. For example, another circuit outputting a voltage representative of frequency may be input to an analog comparator, being compared against a reference voltage equal to the cutoff frequency of approximately 4 kHz. In yet another example, the output frequency need not be digitized, and may instead be converted by an A/D to, e.g., a hex value, with only certain hex values being representative of a frequency high enough to be indicative of certain kinds of faults.

The amplified output of EROUT pin 7 of U2 may further be input to a voltage divider 408 comprising resistors R54, R55. Voltage divider 408 functions to scale down the output of error amplifier EROUT to, for example, a 0-3.3V analog value. The output of voltage divider 408 may be input to controller as FAULT_ID_C and read by an A/D converter internal to controller U50. For example, the U50 internal A/D converter can have a resolution of 8-bit. Alternately, controller U50 may directly receive the error amplifier output (or other output, e.g., indicative of a fault) and convert the value to a digital value. In the embodiment shown in FIG. 4A-4B, the A/D output is useful for converting the error amplifier output to a value (e.g., a hex value) that may be converted by the A/D. In alternate embodiments, the A/D converter may be located external to controller U50. It should be noted that the purpose of the A/D converter is to render a value of the magnitude of voltage across the secondary winding of L1 that may be used by controller. Examples of this output are shown in column C of the below table. Alternate embodiments may render the magnitude in other ways besides an A/D converter, such as multiple analog comparators, each having ascending values of reference voltages. Furthermore, it should be understood that, in alternate embodiments, a voltage divider 408 may not be required, as the voltage divider is only required to the input voltage for the A/D converter—thus, the output range of the error amplifier and type of A/D converter employed will dictate the necessary voltage input range.

Table I below represents the various inputs to U50 for fault detection purposes, as described above: FAULT_ID_A, FAULT_ID_B, FAULT_ID_C. This table, when implemented in an application running on control 110 (or elsewhere), can then provide the user with guidance on why their smart device tripped, i.e. noise, forward or reverse polarity ground faults or grounded neutral faults, and provide guidance one where to look for remove cause of the trip. For example, if the A-B-C U50 inputs are 1-1-X, the application may indicate to the user that a grounded neutral fault was detected and guide to the user to search for unintentional connections from load neutral to earth ground.

TABLE I

| Decision/Conclusion | A | B | C |
|---|---|---|---|
| No Fault | 0 | X | 80h |
| Temporary Noise | 0 | 0 | 80h |
| Reverse Polarity Ground Fault | 1 | 1 | 00h |
| Forward Polarity Ground Fault | 1 | 1 | FFh |
| Grounded Neutral | 1 | 0 | X |

"No fault" as shown in the above table occurs during normal operation of wiring device 400. As shown, the output of SCR (column A) is 0 because there is no fault. The output of the frequency detector (column B), may or may not be 0 (represented as X in the table because it can have either value). Finally, the output of the 8-bit A/D converter may be 80 h, because the nominal or 'no fault' state of this U50 input is half way between 0V and V+ (in FIG. 4A) which after scaling, by voltage divider is a value half way between 0V and 3.3V.

Temporary noise can have a host of causes. As shown above, temporary noise will generally manifest without a trip, and thus SCR output is 0. Usually temporary noise has some high frequency output and thus the frequency detector output (column B) is 0. And finally, the output of the A/D converter may be 80 h, because the nominal or 'no fault' state of this U50 input is half way between 0V and V+ (in FIG. 4A) which, after scaling by voltage divider 408 is a value compatible with voltage controller U50.

A reverse-polarity ground fault occurs when the phase and neutral conductors have been transposed somewhere upstream of wiring device 400, resulting in the load neutral being incorrectly connected to line hot. Referring again to Table I, a reverse-polarity ground fault manifests in a trip, and thus the output of the SCR (column A) is 1. There is no high-frequency output in a reverse-polarity ground fault, and so the output of the frequency detector (column B) is 1. Furthermore, a reverse-polarity ground fault will manifest in the error amplifier falling to its negative rail (e.g., a negative current imbalance between the LINE and NEUTRAL conductors), which yields an A/D converter output approaching 00 h (column C).

Figure 5:
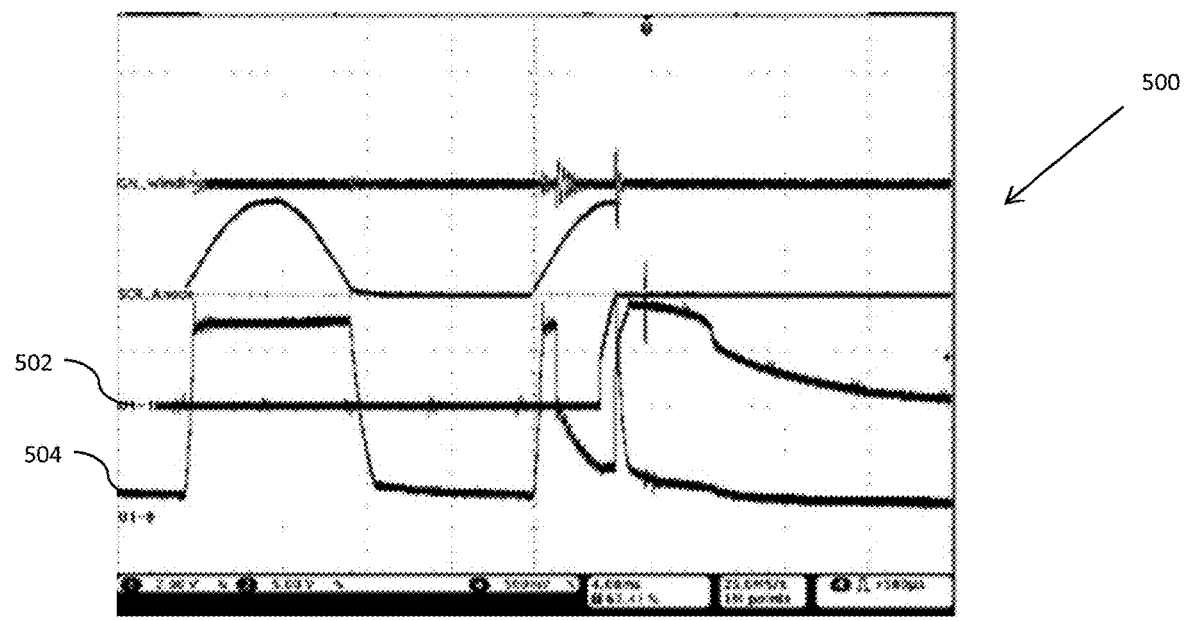
FIG. 5 is an example of signals present in a wiring device experiencing a reverse-polarity ground fault.

FIG. 5 shows an example of the various voltage values described above in connection with the reverse-polarity ground fault. As shown, the SCR output 502 goes high when the output of the error amplifier output 504 drops to its negative rail. Further, as shown, there is no high frequency content from the error amplifier.

A forward-polarity ground fault occurs when the load hot is improperly connected to earth ground. Referring again to Table I, there is a trip, so the output of SCR (column A) again is 1. There is no high-frequency output in a foward-polarity ground fault, and so the output of the frequency detector (column B) is 1. Unlike the reverse-polarity ground, the forward-polarity ground fault will cause the error amplifier to hit its positive rail (e.g., a positive current imbalance between the LINE and NEUTRAL conductors), which yields an A/D converter output approaching FFh.

Figure 6:
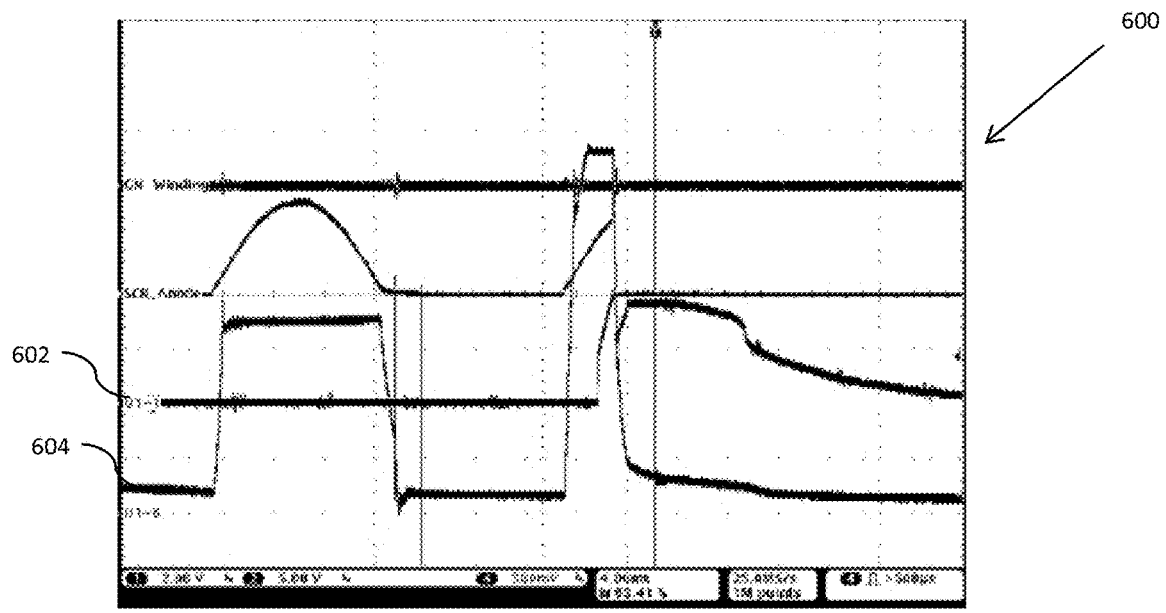
FIG. 6 is an example of signals present in a wiring device experiencing a forward-polarity ground fault.

FIG. 6 shows an example of the various voltage values described above in connection with a forward-polarity ground fault. As shown, the SCR output 602 goes high when the output of the error amplifier 604 rises to its positive rail. Further, as shown, there is no high frequency content from the error amplifier.

Finally, a grounded neutral occurs when the neutral load is improperly connected to earth ground. Referring again to Table I, there is a trip, so the output of SCR (column A) again is 1. A grounded neutral will result in high-frequency current imbalance between the LINE and NEUTRAL conductors, typically between 4-6 kHz, and so the output of the frequency detector (column B) is 0. Finally, there is no stable output from the error amplifier, and so the A/D value is represented as X.

Figure 7:
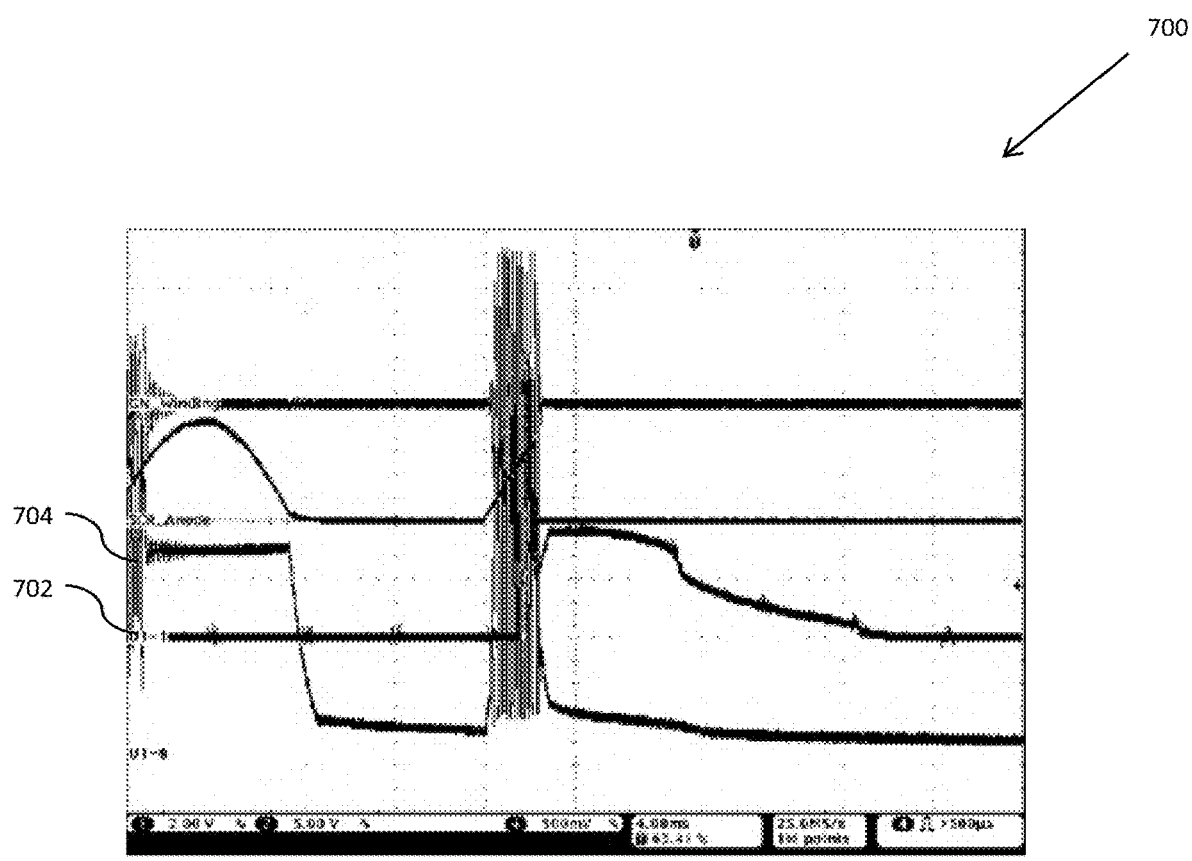
FIG. 7 is an example of signals present in a wiring device in a grounded neutral condition.

FIG. 7 shows an example of the various voltage values described above in connection with a grounded neutral. As shown, the SCR output 702 goes high when the high frequency content appears at the error amplifier output 704.

The above values shown in the table are merely representative and are, in part, dependent on the structure and implementation of wiring device 400. Ultimately, the values in the table are representative of the presence of a fault, the polarity of the current imbalance, and the frequency of the imbalanced current. It should be understood that these values may be measured in a variety of ways by a controller U50, or other controller, to determine the type of fault (or lack thereof) at wiring device 10. Furthermore, it should be understood that the polarities of currents detected by the toroids in the LINE and NEUTRAL conductors and present at the output of the error amplifier may be dependent on the wiring of the toroids, the inputs to the error amplifier, etc. Accordingly, in alternate embodiments, a reverse-polarity ground fault may present with a positive current imbalance and a forward-polarity ground fault may present with a negative current imbalance. Regardless of the particular implementation, a reverse-polarity ground fault and a positive-polarity ground will always present with a predictable current direction and will always be opposite one another.

Temporary noise, as determined above, may be disregarded, e.g., the temporary noise event may not be stored (either locally, in the cloud, or elsewhere), nor reported as analytics. In alternate embodiment, aspects of or the simple event of detecting temporary noise may be stored (either locally, in the cloud, or elsewhere) and/or may be reported. Since temporary noise is usually irrelevant to a typical user, it may be more useful to send aspects of the temporary noise to a technician or manufacturer for diagnostic purposes, where it can be stored and analyzed to determine whether the electrical wiring device 400 (either particularly in the aggregate) is correctly disregarding temporary noise. Those aspects that are stored and/or reported may be those that are useful for diagnostic purposes.

While several inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize, or be able to ascertain using no more than routine experimentation, many equivalents to the specific inventive embodiments described herein. It is, therefore, to be understood that the foregoing embodiments are presented by way of example only and that, within the scope of the appended claims and equivalents thereto; inventive embodiments may be practiced otherwise than as specifically described and claimed.

All references, including publications, patent applications, and patents, cited herein are hereby incorporated by reference to the same extent as if each reference were individually and specifically indicated to be incorporated by reference and were set forth in its entirety herein.

All definitions, as defined and used herein, should be understood to control over dictionary definitions, definitions in documents incorporated by reference, and/or ordinary meanings of the defined terms.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

It should also be understood that, unless clearly indicated to the contrary, in any methods claimed herein that include more than one step or act, the order of the steps or acts of the method is not necessarily limited to the order in which the steps or acts of the method are recited.

Approximating language, as used herein throughout the specification and claims, may be applied to modify any quantitative representation that could permissibly vary without resulting in a change in the basic function to which it is related. Accordingly, a value modified by a term or terms, such as "about" and "substantially" are not to be limited to the precise value specified. In at least some instances, the approximating language may correspond to the precision of an instrument for measuring the value. Here and throughout the specification and claims, range limitations may be combined and/or interchanged; such ranges are identified and include all the sub-ranges contained therein unless context or language indicates otherwise.

The recitation of ranges of values herein are merely intended to serve as a shorthand method of referring individually to each separate value falling within the range, unless otherwise indicated herein, and each separate value is incorporated into the specification as if it were individually recited herein.

All methods described herein can be performed in any suitable order unless otherwise indicated herein or otherwise clearly contradicted by context. The use of any and all examples, or exemplary language (e.g., "such as") provided herein, is intended merely to better illuminate embodiments of the invention and does not impose a limitation on the scope of the invention unless otherwise claimed.

No language in the specification should be construed as indicating any non-claimed element as essential to the practice of the invention.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

It will be apparent to those skilled in the art that various modifications and variations can be made to the present invention without departing from the spirit and scope of the invention. There is no intention to limit the invention to the specific form or forms disclosed, but on the contrary, the intention is to cover all modifications, alternative constructions, and equivalents falling within the spirit and scope of the invention, as defined in the appended claims. Thus, it is intended that the present invention cover the modifications and variations of this invention provided they come within the scope of the appended claims and their equivalents.

What is claimed is:

1. A protective wiring device disposed in an electrical distribution system, the device comprising:
   a plurality of line terminals comprising a line-side phase terminal and a line-side neutral terminal;
   a plurality of load terminals comprising a load-side phase terminal and a load-side neutral terminal;
   a line conductor electrically coupling the line-side phase terminal to the load-side phase terminal;
   a neutral conductor electrically coupling the line-side neutral terminal to the load-side neutral terminal;
   a controller, including a transceiver, being configured to transmit wirelessly via the transceiver, data derived from signals present on at least one of the line conductor or the neutral conductor and to receive wirelessly via the transceiver, at least one command, wherein the data is a type of fault, wherein the type of fault is determined according to at least one of:
   a reverse-polarity ground fault if a negative polarity current imbalance flows between the line conductor and the neutral conductor and a fault is present;
   a forward-polarity ground fault if a positive polarity current imbalance flows between the line conductor and the neutral conductor and a fault is present; and
   a grounded neutral condition exists if the frequency of the imbalanced current is a value greater than 4 kHz and a fault is present.

2. The protective wiring device of claim 1, wherein the controller determines a type of fault based on at least two values, each value being representative of one of: a polarity of a current imbalance between the line conductor and neutral conductor, a frequency of the imbalanced current between the line conductor and neutral conductor, and a presence of a fault.

3. The protective wiring device of claim 1, further comprising a frequency detector configured to detect frequency values greater than 4 kHz.

4. The protective wiring device of claim 3, wherein the frequency detector comprises a high-pass filter in series with an input terminal of a switch.

5. The protective wiring device of claim 1, wherein the controller is configured to send the type of fault to a user.

6. The protective wiring device of claim 1, wherein the command is a reset command.

7. The protective wiring device of claim 1, wherein the controller is configured to disable a remote reset functionality upon a determination that the wiring device tripped from a ground fault.

8. The protective wiring device of claim 1, wherein the command is a test command.

9. A protective wiring device disposed in an electrical distribution system, the device comprising:
   a plurality of line terminals comprising a line-side phase terminal and a line-side neutral terminal;
   a plurality of load terminals comprising a load-side phase terminal and a load-side neutral terminal;
   a line conductor electrically coupling the line-side phase terminal to the load-side phase terminal;
   a neutral conductor electrically coupling the line-side neutral terminal to the load-side neutral terminal;

a controller configured to determine a type of fault based on at least two values, each value being representative of one of: a polarity of a current imbalance between the line conductor and neutral conductor, a frequency of the imbalanced current between the line conductor and neutral conductor, a presence of a fault, wherein the controller is configured to determine, based on the two values, at least one of:

a reverse-polarity ground fault if a negative polarity current imbalance flows between the line conductor and the neutral conductor and a fault is present;

a forward-polarity ground fault if a positive polarity current imbalance flows between the line conductor and the neutral conductor and a fault is present; and a grounded neutral condition exists if the frequency of the imbalanced current is a value greater than 4 kHz and a fault is present.

\* \* \* \* \*